US012802734B2

(12) United States Patent
Vogelsang et al.

(10) Patent No.: US 12,802,734 B2
(45) Date of Patent: Nov. 17, 2026

(54) DYNAMIC, RANDOM-ACCESS MEMORY WITH INTERLEAVED REFRESH

(71) Applicant: Rambus Inc., San Jose, CA (US)

(72) Inventors: Thomas Vogelsang, Jericho, VT (US); Torsten Partsch, Raleigh, NC (US); Arthur Behiel, Pleasanton, CA (US)

(73) Assignee: Rambus Inc., San Jose, CA (US)

( * ) Notice: Subject to any disclaimer, the term of this patent is extended or adjusted under 35 U.S.C. 154(b) by 163 days.

(21) Appl. No.: 18/871,545

(22) PCT Filed: Jun. 4, 2023

(86) PCT No.: PCT/US2023/067906

§ 371 (c)(1),
(2) Date: Dec. 4, 2024

(87) PCT Pub. No.: WO2023/244915

PCT Pub. Date: Dec. 21, 2023

(65) Prior Publication Data

US 2025/0349337 A1 Nov. 13, 2025

Related U.S. Application Data

(60) Provisional application No. 63/352,267, filed on Jun. 15, 2022.

(51) Int. Cl.
*G11C 11/406* (2006.01)

(52) U.S. Cl.
CPC *G11C 11/40618* (2013.01); *G11C 2211/4063* (2013.01)

(58) Field of Classification Search
CPC ...... G11C 11/40618; G11C 2211/4063; G11C 11/40603; G11C 11/40615
(Continued)

(56) References Cited

U.S. PATENT DOCUMENTS 6,201,729 B1 3/2001 Rivers
6,360,294 B1 3/2002 Ferrant et al.
(Continued)

FOREIGN PATENT DOCUMENTS

KR 20030082365 A * 10/2003 ............... G11C 8/18

OTHER PUBLICATIONS

Notification of Transmittal of the International Search Report and the Written Opinion of the International Searching Authority, or the Declaration with Mail Date Nov. 17, 2023 re: Int'l Appln. No. PCT/US2023/067906. 16 pages.
(Continued)

*Primary Examiner* — Fernando Hidalgo
(74) *Attorney, Agent, or Firm* — Silicon Edge Law Group LLP; Arthur J. Behiel

(57) ABSTRACT

A memory includes a local control circuitry that manages refresh transactions using a set of sense amplifiers separate from those used for access (read and write) transactions. The local control circuitry interrupts refresh transactions to prioritize access requests, thereby offering improved memory performance. The local control circuitry also divides refresh transactions into phases and periods based on whether the refresh transaction requires access to bitlines used for read and write access. This division allows the local control circuitry to interleave and interrupt refresh transactions with access transactions in a manner that minimizes access interference.

21 Claims, 9 Drawing Sheets

(58) Field of Classification Search
USPC .......................................................... 365/222
See application file for complete search history.

(56) References Cited

U.S. PATENT DOCUMENTS

| | | | | |
|---|---|---|---|---|
| 6,459,650 | B1 * | 10/2002 | Lin | G11C 8/18 365/233.17 |
| 6,826,106 | B2 | 11/2004 | Chen | |
| 7,002,864 | B2 | 2/2006 | Kim et al. | |
| 7,009,902 | B2 | 3/2006 | Dortu | |
| 7,035,133 | B2 | 4/2006 | Kim et al. | |
| 7,043,599 | B1 | 5/2006 | Ware et al. | |
| 7,093,067 | B2 | 8/2006 | Sunaga et al. | |
| 7,797,511 | B2 | 9/2010 | Vogelsang | |
| 8,331,184 | B2 | 12/2012 | Wang | |
| 8,773,925 | B2 | 7/2014 | Koya et al. | |
| 8,908,454 | B2 | 12/2014 | Vogelsang et al. | |
| 8,913,449 | B2 | 12/2014 | Chung | |
| 9,761,297 | B1 | 9/2017 | Tomishima | |
| 10,762,945 | B2 | 9/2020 | Hou et al. | |
| 11,114,150 | B2 | 9/2021 | Vogelsang et al. | |
| 2002/0034114 | A1 | 3/2002 | Tobita | |
| 2003/0185079 | A1 * | 10/2003 | Takatsuka | G11C 11/406 365/222 |
| 2003/0231521 | A1 | 12/2003 | Ohsawa | |
| 2004/0036096 | A1 * | 2/2004 | Lovett | G11C 11/405 257/296 |
| 2005/0133852 | A1 | 6/2005 | Shau | |
| 2006/0215467 | A1 | 9/2006 | Partsch | |
| 2011/0235409 | A1 | 9/2011 | Kang et al. | |
| 2016/0005455 | A1 | 1/2016 | Vogelsang et al. | |
| 2020/0118614 | A1 | 4/2020 | Kim et al. | |
| 2020/0273517 | A1 | 8/2020 | Yamamoto | |
| 2021/0375354 | A1 | 12/2021 | Partsch et al. | |

OTHER PUBLICATIONS

EP Extended European Search Report with Mail Date May 8, 2026 re: EP Appln. No. 23824705.0. 10 pages.

* cited by examiner

DYNAMIC, RANDOM-ACCESS MEMORY WITH INTERLEAVED REFRESH

BACKGROUND

Dynamic random-access memory (DRAM) is a type of semiconductor memory in which arrays of memory cells store digital values as voltage levels. A memory cell comprises a capacitor that can be charged or discharged to represent a "bit," a logical one or zero. The capacitor can be selectively connected to a "bitline" so that the voltage across the capacitor, relatively high when charged, can be sensed to read the stored bit. The charge on the capacitor leaks away and thus must be refreshed periodically to prevent a loss of the stored data. A refresh transaction senses the voltage across a memory cell's capacitor, interprets the bit value represented thereby, and writes that value back to the capacitor as the full, refreshed cell voltage. Refresh transactions can interfere with access transactions and thus limit the sustained bandwidth of a DRAM.

DETAILED DESCRIPTION

A memory system includes a host controller that issues access requests to a dynamic, random-access memory (DRAM) and a local controller that generates refresh requests. Access requests from the host controller initiate access transactions for the reading and write of data. Access requests include precharge requests that ready a bank of memory cells for access, activate requests to open a row of memory cells for access, read requests that initiate the reading of data from an open row of memory cells, and write requests that initiate the writing of data to an open row. The local control circuitry initiates refresh transactions asynchronously with respect to access requests from the host. The local control circuity divides refresh transactions into phases and periods that are interleaved with and interrupted by access transactions to minimize access interference, and thereby offer improved memory performance. A first phase of a refresh transaction senses and stores a bit value from a memory cell; a second phase restores the value to the cell. The first phase is divided into periods based upon whether the refresh transaction requires bitline access. Periods of bitline usage are time-shifted and interleaved with access transactions that require the same bitline to read or write data so as not to interfere with access. Access transactions interrupt the second phase, leaving the local control circuitry to attempt cell restoration later when the access transaction or transactions is complete.

Figure 1:
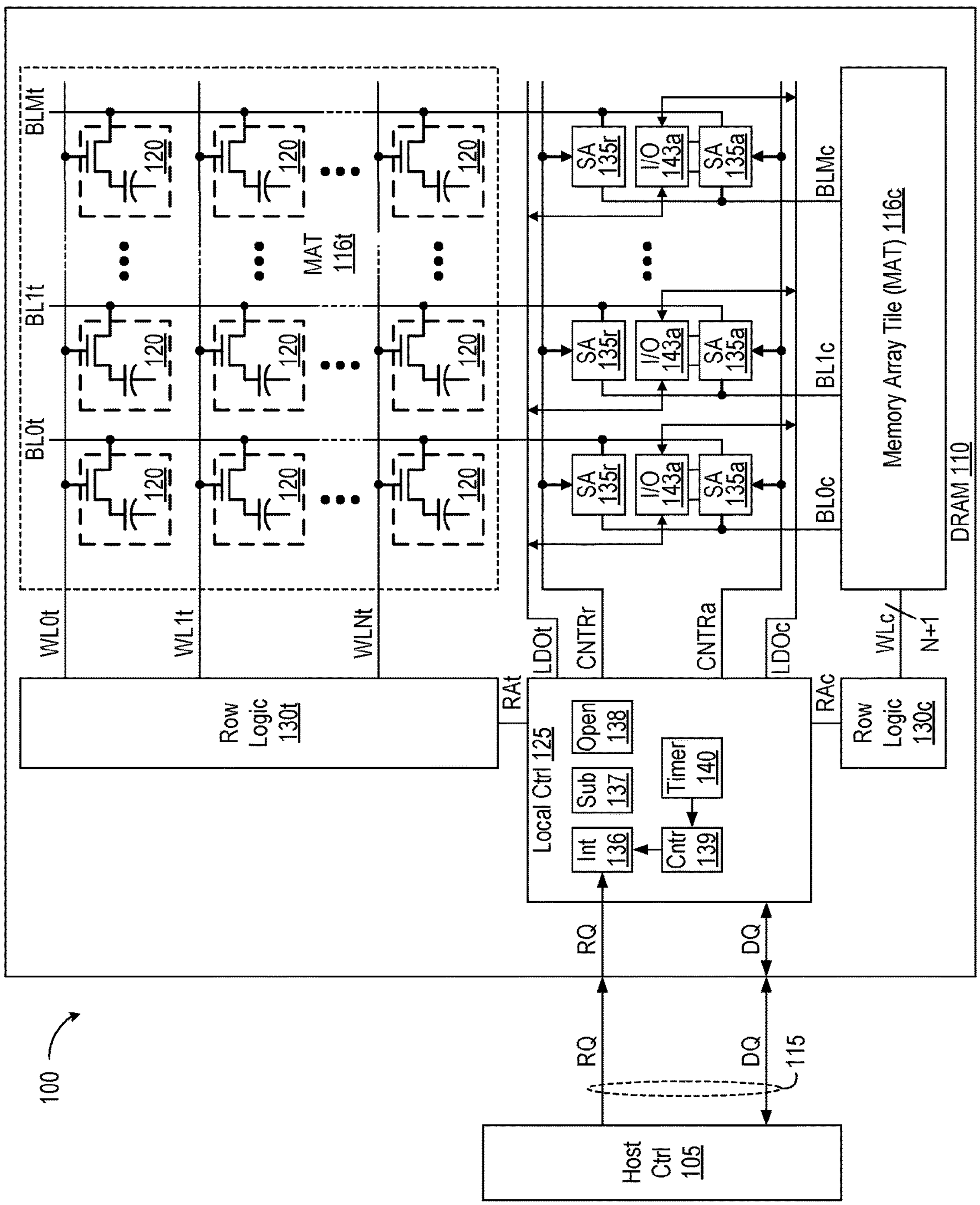
FIG. 1 depicts a memory system 100 in which a host controller 105 provides access to a DRAM 110 via a communication channel 115 that communicates access requests (e.g. read and write requests) RQ and data DQ.

FIG. 1 depicts a memory system 100 in which a host controller 105 provides access to a DRAM 110, a memory device, via a communication channel 115 that communicates access requests (e.g. precharge, activate, read, and write requests) RQ and data DQ. DRAM 110 includes memory-array tiles (MATs) 116*t* and 116*c*, each an array with rows and columns of memory cells 120. Local control circuitry 125 responds to requests RQ by issuing control signals RAt and RAc to respective row logic 130*t* and 130*c* that selectively assert signals on wordlines WLt[N:0] and WLc[N:0] to "open" a row of memory cells 120, making memory-cell voltages stored therein available on respective bitlines BLt [M:0] and BLc[M:0] to be sensed by stripes of sense amplifiers 135*a* and 135*r*. A stripe of input/output (I/O) circuits 143*a* communicates data to and from local control circuitry 125 via complementary signals LDOt and LDOc on like-named signal paths. Local control circuitry 125 services access requests using access sense amplifiers 135*a* (the "a" for "access") and refresh requests using a separate set of refresh sense amplifiers 135*r* (the "r" for "refresh").

Local control circuitry 125 includes a request interface 136 that receives and interprets requests from host controller 105, a resource-substitution register 137 that maps the addresses of defective memory resources to redundant resources, a refresh-open register 138 that maintains a list of incomplete (open) refresh transactions, a counter 139 that includes the address of a row to be refreshed, and a timer 140 that increments the counter to step through the rows. The functions of these elements are detailed below.

Host controller 105 and memory device 110 are integrated-circuit (IC) devices, commonly referred to as "chips." Host controller 105 can be a separate, standalone chip, or integrated into another chip. For example, a memory controller may be included on a single die with a microprocessor or included as part of a more complex system such as a system on a chip (SOC). DRAM 110 includes banks/sub-banks of memory-array tiles (MATs) 116, though only two are shown for ease of illustration. Other elements unnecessary for understanding the operation of system 100 are likewise omitted. The upper and lower MATS are respectively labeled 116*t* and 116*c*, the "t" and "c" for "true" and "complement." A cell or array is not permanently true or complement; rather, a "true" cell or array is one being read from or written to and a complement an identical element that serves as a reference.

Figure 2:
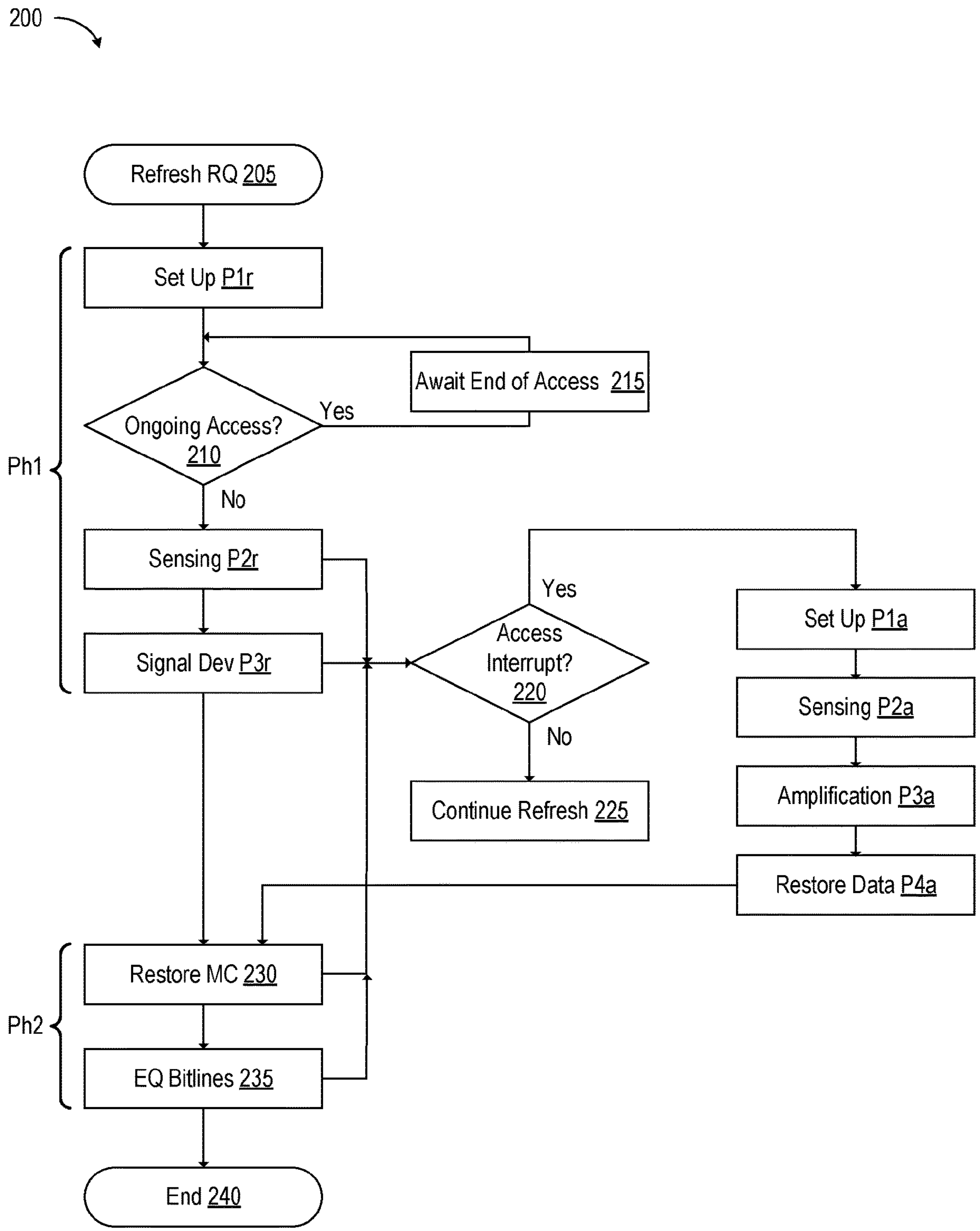
FIG. 2 is a flowchart 200 illustrating a refresh transaction in accordance with one embodiment.

FIG. 2 is a flowchart 200 illustrating a refresh transaction in accordance with one embodiment. Timer 140 periodically increments causing refresh counter 139 to instigate a refresh transaction. Local control circuitry 125 begins refresh phase one (Ph1) by evaluating the address of the refresh request. The set-up period P1*r* (for "Period 1, refresh") does not require bitline access and so does not interfere with any ongoing access transaction. Request interface 136 reviews resource-substitution register 137 for the requested address, making an address substitution to a redundant resource if needed. Local control circuitry 125 then issues a signal, main-wordline falling MWF (not shown), that initiates the assertion of wordline signal WL0*t* to open the selected memory cell 120.

Per decision 210, if there is an ongoing access transaction using the bitlines required by the refresh request, local control circuitry 125 completes the activity of refresh period P1*r* and awaits completion of the ongoing access (215). If there is no ongoing access transaction, local control circuitry 125 enters refresh phase one, period two (Ph1, P2*r*) and senses the memory cells identified during set-up period P1*r*. Using the example of a read transaction directed to the upper-left memory cell 120 of FIG. 1, wordline WL0*t* is asserted to connect the capacitor to bitline BL0*t*, thereby sharing the charge stored on the capacitor with a sense input of refresh sense amplifier 135*r*. The other sense input of amplifier 135*r* is connected to bitline BL0*c*, which serves as a reference. With the charge so shared, local control circuitry 125 disconnects refresh sense amplifier 135*r* from bitlines BL0*t* and BL0*c* and, in refresh period three P3*r*, allows refresh sense amplifier 135*r* to amplify the sensed difference between the voltages on bitlines BL0*t* and BL0*c*.

The act of sensing destroys the data from the memory cell and retains the sensed value in refresh sense amplifier 135*r*, completing the first phase Ph1 of the refresh transaction. Per decision 220, if local control circuitry 125 receives an access request during signal-development period P3*r*, local control circuitry 125 interrupts the refresh transaction to tend to the access request. Local control circuitry 125 evaluates access requests to determine whether register 138 indicates the target address is the subject of an open refresh transaction. A write access to an address listed in register 138 proceeds normally and the target address is removed from register 138. For a read access to the memory cell undergoing a refresh transaction, local control circuitry 125 reads the value stored in refresh sense amplifier 135*r* and register 138 maintains the open address. For another memory cell connected to the same bitlines, local control circuitry 125 begins an access set-up period P1*a* (for "Period 1, access") during which the access request is evaluated and the bitlines equalized. In the second period P2*a*, an access sense period, local control circuitry 125 asserts the wordline signal (e.g. WL1*t*) and connects access sense amplifier 135*a* to bitlines BL0*t* and BL0*c* to allows access sense amplifier 135*a* to sense the bit voltage representative of a stored value. In amplification period P3*a*, local control circuitry 125 disconnects access sense amplifier 135*a* from the bitlines and allows the sensed signal to develop within the access sense amplifier. Once the signal is amplified, local control circuitry 125 enters a restoration period P4*a* in which it reconnects access sense amplifier 135*a* to bitlines BL0*t* and BL0*c* and opens the requested wordline to restore the voltage in the accessed memory cell. Local control circuitry 125 also reads the accessed data using the corresponding I/O circuit 143*a*, making that data available to the requesting host. With the access thus completed, local control circuitry 125 issues control signals CNTRa that disconnect access sense amplifier 135*a* from the bitlines and thus allow refresh phase two Ph2, value restoration, to proceed. The periods of a write transaction are different from those of a read transaction because the data need not be read from the targeted memory cell.

Returning to decision 220, if no access request is received during phase one Ph1, then the refresh transaction is allowed to continue as normal (225). Interrupting phase one Ph1 during sensing period P2*r* does not interference with the sensing because the refresh sense operation has time to complete during the set-up phase P1*a* of the access transaction, a time during which access sense amplifier 135*a* is decouple from the bitlines. Interrupting a refresh transaction during signal development P3*r* does not interfere with phase one of the refresh transaction because signal development does not require refresh sense amplifier 135*r* to be coupled to the bitlines.

However the process reaches refresh phase two Ph2, refresh sense amplifier 135*r* is reconnected to bitlines BL0*t* and BL0*c* and wordlines WL0*t* reasserted to open the memory cell and restore its contents (230). Bitlines BL0*t* and BL0*c* are once again equalized (235), bringing the refresh transaction to an end (240). The act of setting the bitline voltages to a common voltage intermediate between high and low supply voltages is commonly termed "pre-charging" and readies the bitlines for the next access.

Figure 3:
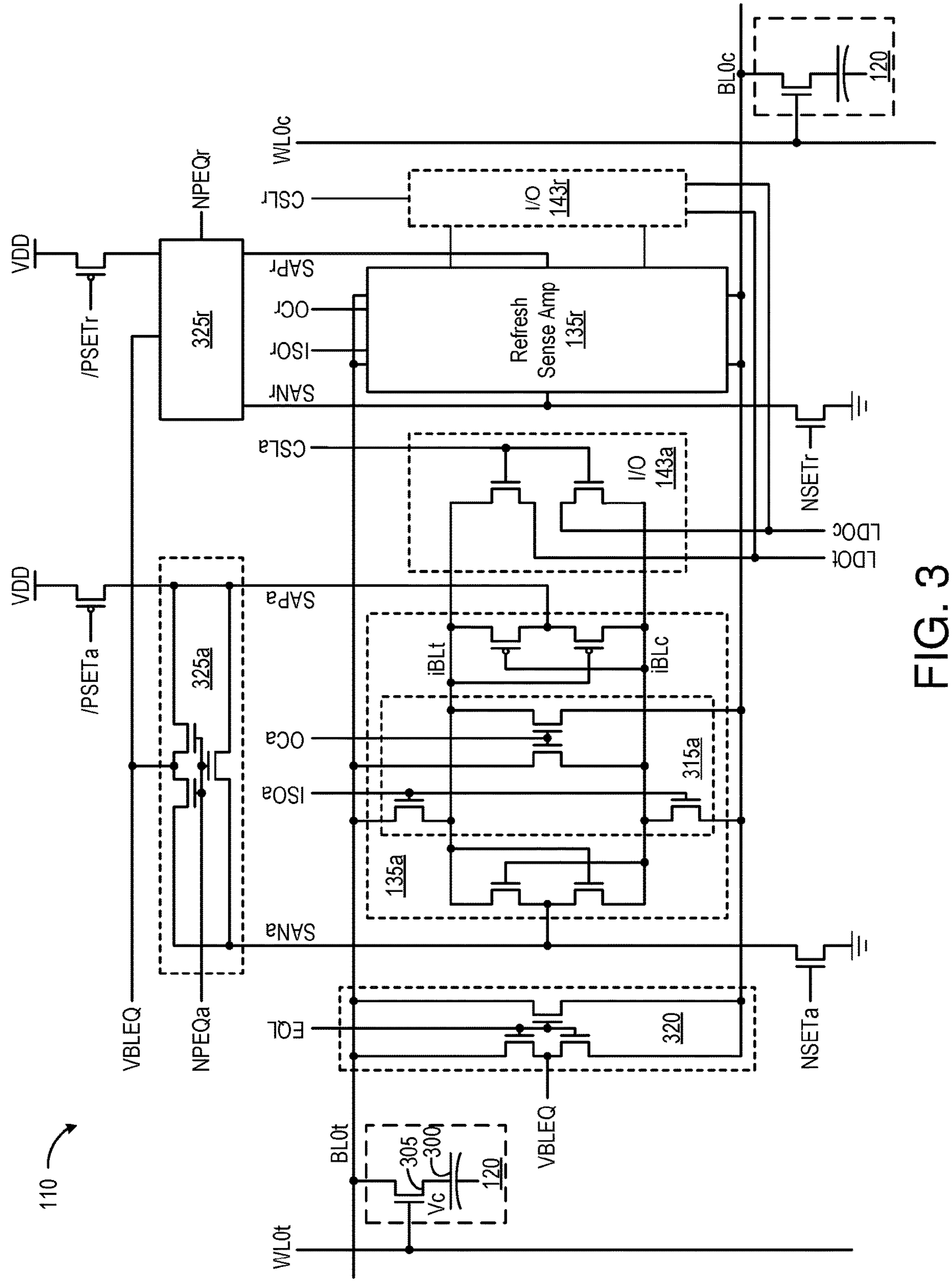
FIG. 3 schematically represents a portion of DRAM 110 of FIG. 1 in accordance with one embodiment.

FIG. 3 schematically represents a portion of DRAM 110 of FIG. 1 in accordance with one embodiment, like-identified elements being the same or similar. Access sense amplifier 135*a* and refresh sense amplifier 135*r* are identical in this example and both are selectively coupled between complementary bitlines BL0*t* and BL0*c*. Each sense amplifier detects and amplifies voltage differences between bitlines BL0*t* and BL0*c* when a one of wordlines WL0*t* and WL0*c* is asserted to discharge a capacitor 300 through a transistor 305 and onto the respective bitline, the other bitline serving as a reference. In this example, bitline BL0*t* is used to read the contents of the leftmost memory cell 120 against reference bitline BL0*c*. An optional I/O circuit 143*r* can be included to read the contents of refresh sense amplifier 135*r* and thus facilitate read access to open wordlines.

Access sense amplifier 135*a* includes a pair of cross-coupled inverters that is switched on by an evaluate control block 315. The cross-coupled inverters comprise n-channel field effect transistors (NFETs) on the left and p-channel field effect transistors (PFETs) on the right. The uppermost NFET/PFET pair form a first inverter that is cross-coupled to a second inverter formed using the lowermost pair. The negative supply voltage SANa and the positive supply voltage SAPa to the inverters are selectively provided when local control circuitry 125 asserts respective control signals NSETa and/PSETa, both of which are part of the control port labeled CNTRa in FIG. 1. Signals NSETa and/PSETa are deasserted and signal EQL asserted to allow a bitline-equalization block 320 to equalize the voltage levels on bitlines BLt and BLc between sense operations. A power-supply equalization block 325*a* likewise equalizes supply lines SANa and SAPa to a common intermediate voltage VBLEQ between sense operations. I/O circuit 143*a* allows local control circuitry 125, by asserting control signal CSLa, to move complementary data signals LDOt/LDOc to and from bitlines BLt/BLc during a write and read access, respectively. Each control node and signal to access sense amplifier 135*a* is designated with a trailing "a" for "access." Control nodes and signals to refresh sense amplifier 135*r* are similarly designated with a trailing "r" for "refresh." Signals with a leading "/" are active low, meaning that they are asserted/deasserted as a relatively low/high voltage.

In access sense amplifier 135*a*, evaluate control block 315*a* receives an offset cancellation signal OCa and an isolation signal ISOa from local control circuitry 125. The term "offset" refers to characteristic differences between the components of access sense amplifier 135*a* that can imbalance the amplifier and thus produce sense errors. Asserting signal OCa connects internal bitline nodes iBLt and iBLc to external bitlines BL0*c* and BL0*t*, the opposite connectivity employed when isolation signal ISOa is asserted to sense the voltage difference between bitlines BL0*t* and BL0*c*. Asserting signal OCa briefly senses the characteristic offset to impose a corresponding voltage offset between bitlines BL0$t$ and BL0$c$ that counteracts the effect of the characteristic offset when signal ISOa is asserted. Deasserting both the OCa and ISOa signals disconnects access sense amplifier 135$a$ from the bitlines BL0$t$ and BL0$c$. Refresh sense amplifier 135$r$ is similarly controlled to sense and amplify the voltage difference between bitlines BL0$t$ and BL0$c$ during refresh phase one.

Refresh sense amplifier 135$r$ can be read after refresh phase one to satisfy a read request to the open wordline. In one embodiment, local control circuitry 125 directs refresh I/O circuit 143$r$ to read the contents of refresh sense amplifier 135$r$. In case of an access during refresh phase two, an activate command opens or keeps open the worldline and local control circuitry 125 uses refresh sense amplifier 135$r$ and related I/O circuit 143$r$ in lieu of access sense amplifier 135$a$ and I/O circuit 143$a$. A precharge command restore memory cell 120 from refresh sense amplifier 135$r$. Another embodiment omits I/O circuit 143$r$; instead, an activate command ACT opens or maintains open the wordline and local control circuitry 125 copies the data from refresh sense amplifier 135$r$ to access sense amplifier 135$a$ over bitlines BL0$t$ and BL0$c$ before reading from or writing to sense amplifier 135$a$. To copy between the sense amplifiers, signals both isolation signals ISOa and ISOr are asserted simultaneously while signals NSETa and/PSETa are deasserted. Refresh sense amplifier 135r drives bitlines BL0$t$ and BLoc apart to produce a voltage difference across internal bitlines iBLt and iBLc of access sense amplifier 135$a$. Signals NSETa and/PSETa are asserted after a short delay to drive internal bitlines iBLt and iBLc of access sense amplifier 135$a$ to the value on the same nodes of refresh sense amplifier 135$r$. Thereafter, the access proceeds from access sense amplifier 135$a$ as noted previously. Refresh phase two can be aborted and the address of the open wordline removed from register 138 because the effected memory cells are written by access sense amplifier 135$a$ as part of the ongoing access transaction.

In case of an access to a wordline interrupting the set-up period P1$r$ of refresh phase one to the same wordline, the set-up period is aborted, and the refresh transaction replaced by the requested access transaction. The access transaction restores or overwrites the affected memory cells and thus obviates the refresh transaction. If an access interrupts the sensing period P2$r$ of refresh phase one, however, the refresh transaction ends refresh phase one early by foregoing the wordline-closing and equalization steps.

Figure 4:
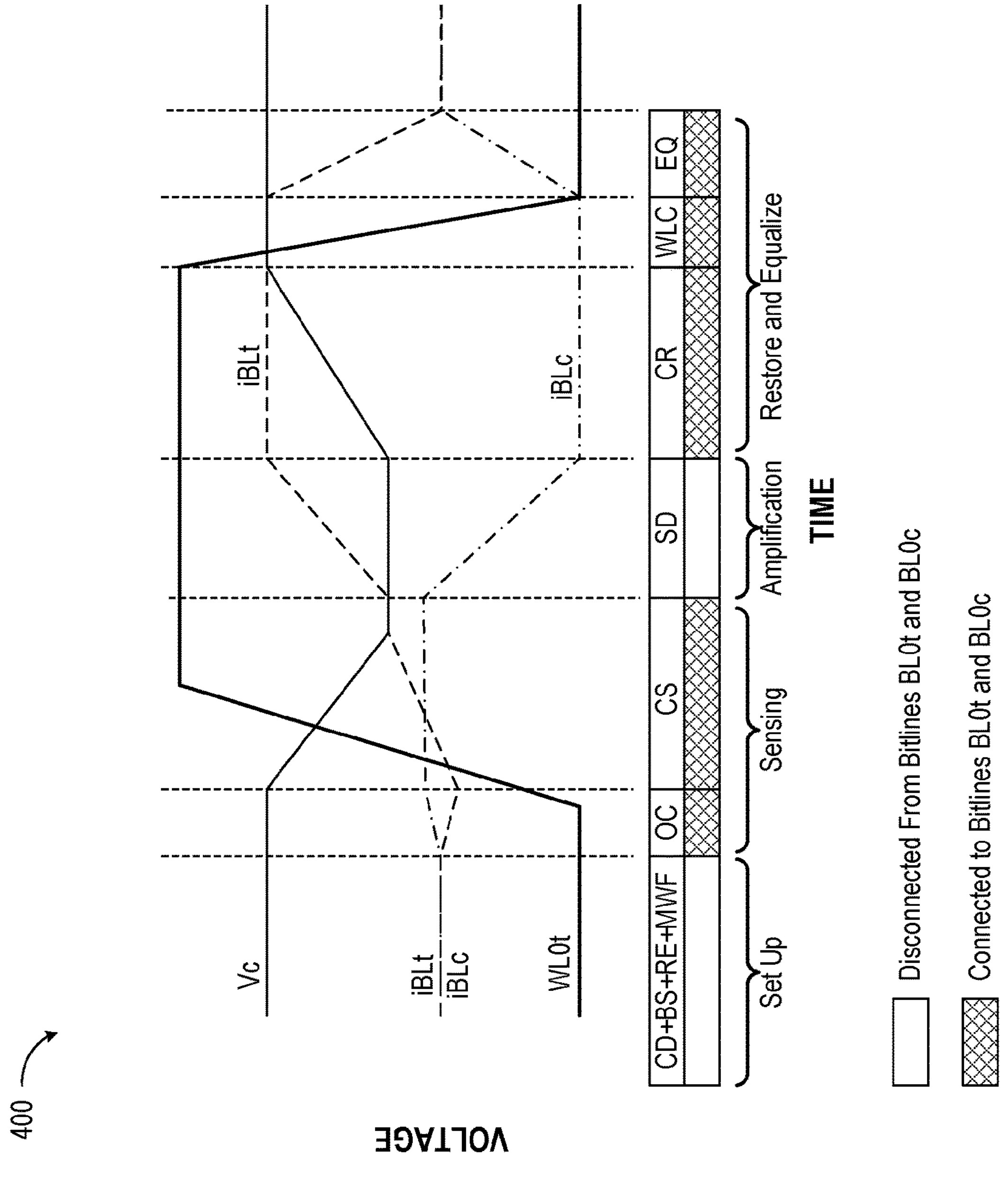
FIG. 4 is a waveform diagram 400 illustrating voltage levels for a read-access transaction using access sense amplifier 135*a* using signal designations that correspond to nodes of FIG. 3.

FIG. 4 is a waveform diagram 400 illustrating voltage levels for a read-access transaction using access sense amplifier 135$a$ using signal designations that correspond to nodes of FIG. 3. Signal Vc refers to a memory-cell voltage across capacitor 300 that represents a stored binary value; signals iBLt and iBLc represent voltage levels on complementary input nodes of amplifier 135$a$ that can be isolated from bitlines BL0$t$ and BL0$c$ via control block 315, and signal WL0$t$ represents the wordline voltage that is raised (asserted) to enable transistor 305 in the memory cell 120 at left in FIG. 3 to share the charge stored on the corresponding capacitor 300 with bitline BL0$t$. Voltage Vc across capacitor 300 is proportional to the stored charge. When capacitor 300 is connected to the bitline BL0$t$, the resultant charge sharing changes the bitline voltage by a small amount in comparison with the initial stored voltage. Access sense amplifier 135$a$ senses and amplifies the bitline voltage to recover the stored bit.

Labels along the time axis summarize various periods of the read-access transaction. With reference to memory system 100 of FIG. 1, host controller 105 initiates the transaction by issuing a read request, or read command, to local control circuitry 125, which responsively directs control signals CNTRa to manage the transaction in the manner depicted in FIG. 4.

Returning to FIG. 1, local control circuitry 125 decodes the command (CD=command decode) to determine the type and address of the access. The address allows local control circuitry 125 to select the bank of memory cells (BS=bank select) and perform a redundancy evaluation RE by which local control circuitry 125 can map requests from defective memory resources to redundant resources provided for that purpose. Local control circuitry 125 then issues a signal main-wordline falling MWF (not shown) that initiates the assertion of wordline signal WL0$t$ to read the selected memory cell 120.

Before wordline signal WL0$t$ is asserted, sense amplifier 135$a$ is powered on by the assertion of signals/PSETa and NSETa and offset-compensation signal OCa is asserted, driving the voltages on interior bitline nodes iBLt and iBLc apart to a degree determined by an imbalance inherent to sense amplifier 135$a$./PSETa, NSETa, and OCa are then deasserted. Wordline signal WL0 is then asserted to initiate charge-sharing CS in which capacitor 300 discharges onto bitline BL0$t$, causing voltage Vc to fall and the voltage on bitline BL0$t$ to rise. Though not shown, signal ISOa is also asserted so the voltages on bitlines BL0$t$ and BL0$c$ are conveyed to nodes iBLt and iBLc for sensing. Next, in signal development SD, isolation signal ISO is deasserted to isolate amplifier 135$a$ from bitlines BL0$t$ and BL0$c$. Amplifier 135$a$ then amplifies the relatively small voltage disparity between nodes iBLt and iBLc. While not shown, local control circuitry 125 can read the data via I/O circuit 143$a$.

Charge restoration is performed with wordline signal WL0$t$ and signal ISOa asserted so amplifier 135$a$ charges capacitor 300 to the restored level. Once restored, the wordline closes (WLC) and equalization blocks 320 and 325$a$ are used to equalize the bitlines and the supply nodes of amplifier 135$a$ in preparation for the next access. As noted in a key at bottom left, amplifier 135$a$ is disconnected from bitlines BL0$t$ and BL0$c$ for some periods of the read transaction. These periods can be exploited for refresh transactions that require access to the same bitlines. Were this a write transaction, the sensing and amplification periods would be omitted, and a new bit would be presented across the bitlines via I/O circuit 143$a$ to be stored in the target memory cell.

Figure 5:
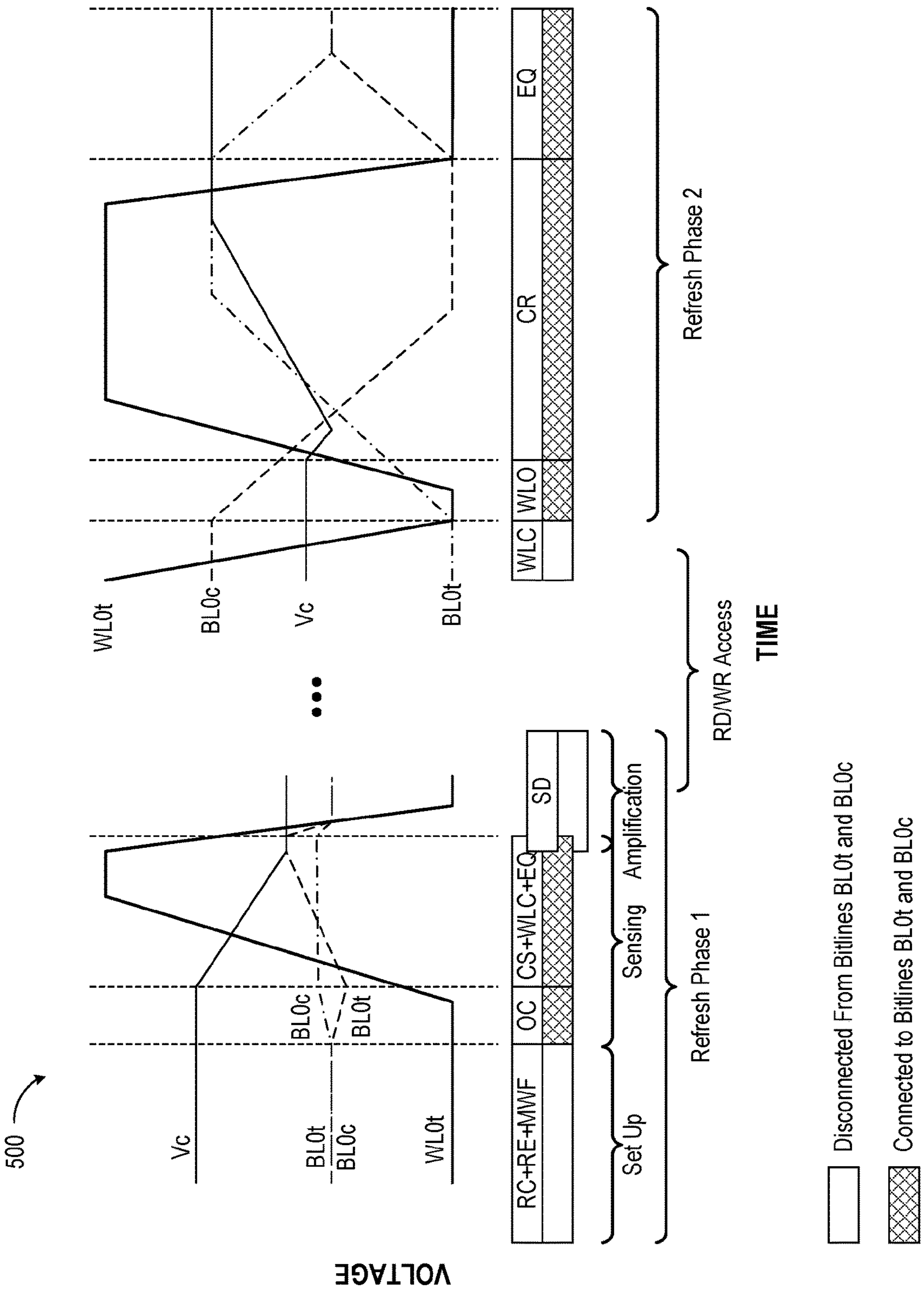
FIG. 5 is a waveform diagram 500 illustrating voltage levels for a refresh transaction using refresh sense amplifier 135*r*.

FIG. 5 is a waveform diagram 500 illustrating voltage levels for a refresh transaction using refresh sense amplifier 135$r$. Diagram 500 divides the refresh transaction into two phases, a first phase in which amplifier 135$r$ senses a value from a memory cell and a second phase in which amplifier 135 restores the sensed value to the memory cell. The first phase is further divided into periods based on whether the operation performed requires access to bitlines BL0$t$ and BL0$c$. The phase and period divisions allow refresh transactions to be interleaved with and interrupted by access transactions. Access requests from host controller 105 can and likely will arrive asynchronously with respect to refresh transactions generated internally by local control circuitry 125. In this context, "asynchronous" refers to the onset of access and refresh transactions rather than to the timing of signals relative to a clock signal.

With reference to FIG. 1, local control circuitry 125 initiates the refresh transaction to a given wordline, which is to say the memory cells 120 under control of that wordline, the refresh command RC specifying an address specific to the wordline within the bank. Local control circuitry 125 performs a redundancy evaluation RE and issues a signal main-wordline falling MWF as noted above in connection with FIG. 4. In this set-up period of refresh phase 1 the depicted voltages remain essentially constant and internal nodes iBLt and iBLc within amplifier 135*r* are isolated from bitlines BL0*t* and BL0*c*. Bitline equalization following a prior access can be completed during this period. Internal bitline nodes iBLt and iBLc are not shown for refresh sense amplifier 135*r* but are essentially identical to those of access sense amplifier 135*a*.

Before wordline signal WL0*t* is asserted, sense amplifier 135*r* is powered by the assertion of signals/PSETr and NSETr and offset-compensation signal OCr is asserted, driving the voltages on bitlines BLt and BLc apart to a degree determined by the imbalance inherent to sense amplifier 135*r*./PSETa, NSETa, and OCa are then deasserted. Wordline signal WL0*t* is then asserted to initiate a charge-sharing and wordline-close period CS+WLC in which capacitor 300 discharged onto bitline BL0*t*, causing voltage Vc to fall and the voltage on bitline BL0*t* to rise relative to the voltage on bitline BL0*c*. Though not shown, in this bitline sensing period signal ISOr is also asserted so the voltages on bitlines BL0*t* and BL0*c* are conveyed to the interior bitline nodes of refresh sense amplifier 135*r* for sensing. In the final period of refresh phase 1, amplification, isolation signal ISOr is deasserted to isolate amplifier 135*r* from bitlines BL0*t* and BL0*c*. Amplifier 135*r* then amplifies the relatively small voltage disparity and retains the amplified value as local control circuitry 125 equalizes bitlines BL0*t* and BL0*c* in preparation for a subsequent refresh phase 2 or access transaction.

Refresh phase 2 is here illustrated as following on a wordline-close operation WLC from a prior read or write access that left bitlines BL0*t* and BL0*c* respectively high and low, the opposite of the value held in refresh sense amplifier 135*r* as a result of refresh phase 1. Local control circuitry opens the wordline (asserts signal WL0*t*) to provide access to the capacitor 300 of the target memory cell and asserts signal ISOr to connect the internal bitline nodes of amplifier 135*r* to bitlines BL0*t* and BL0*c*, thereby allowing amplifier 135*r* to restore the refresh voltage representative of stored value to the memory cell during a period of charge refresh CR. Local control circuitry 125 then closes the wordline and equalizes the bitlines and supply terminals of refresh sense amplifier 135*r* in preparation for the next transaction.

Refresh sense amplifier 135*r* requires access to bitlines BL0*t* and BL0*c* during refresh phase two. Phase 2 can be interrupted without loss of data, however, because the value for the refresh is retained in refresh sense amplifier 135*r* until the end of phase 2. Local control circuitry 125 takes advantage of the interruptibility of refresh phase 2 to prioritize read and write accesses.

Figure 6:
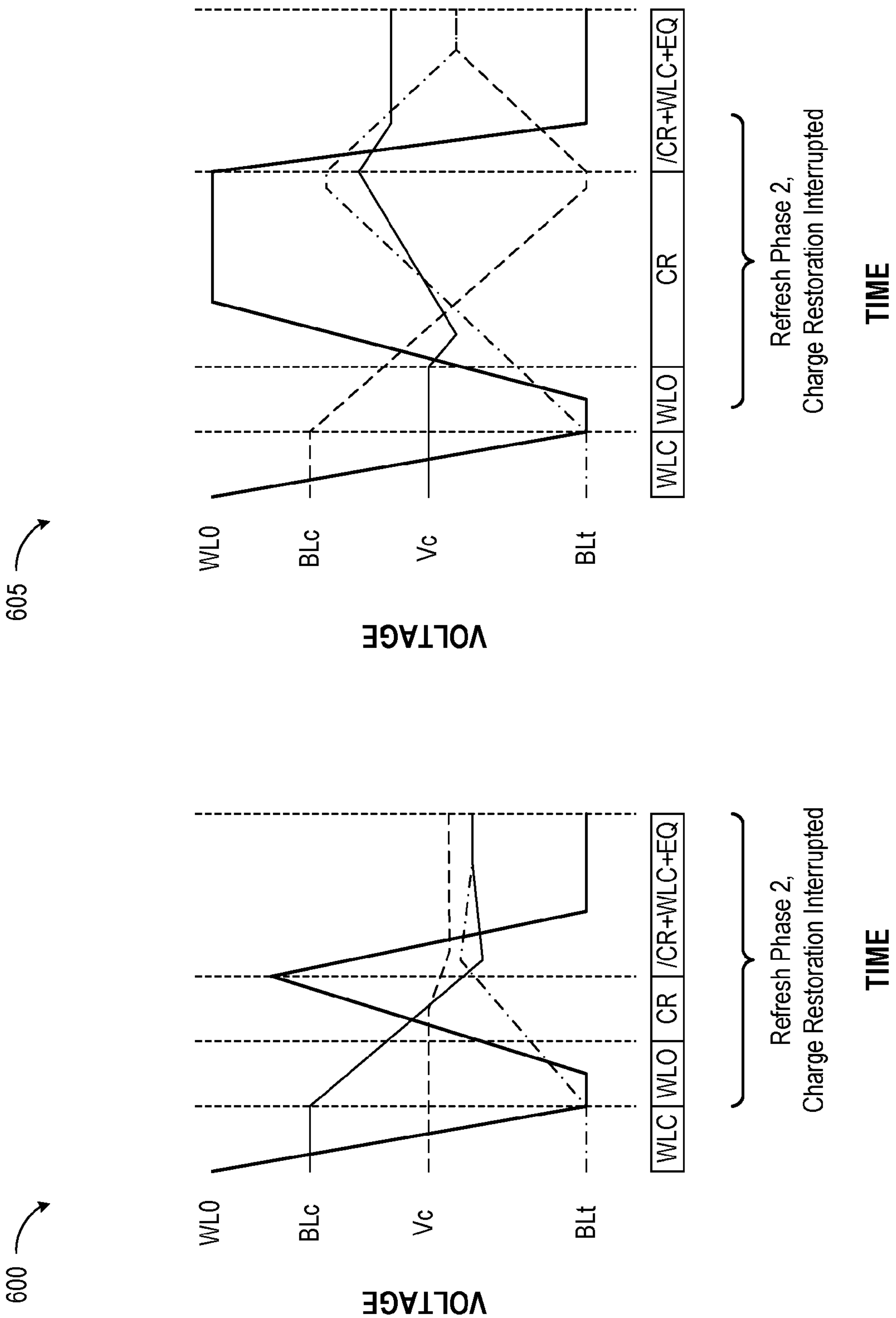
FIG. 6 includes a pair of waveform diagrams 600 and 605 each illustrating how refresh phase 2 can be interrupted to service an access transaction.

FIG. 6 includes a pair of waveform diagrams 600 and 605 each illustrating how refresh phase 2 can be interrupted to service an access transaction. These phases are operationally similar to refresh phase 2 of FIG. 5. In diagram 600, however, local control circuitry 125 interrupts refresh sense amplifier 135*r* early in charge-restoration period CR—the interruption designated/CR—before closing the wordline (WLC) and equalizing the bitlines in preparation for the requested access. This premature closing of refresh phase two can be accomplished during the set-up period of the requested access. Diagram 605 is similar to diagram 600 but the refresh interruption occurs later in the charge-restoration period.

Figure 7:
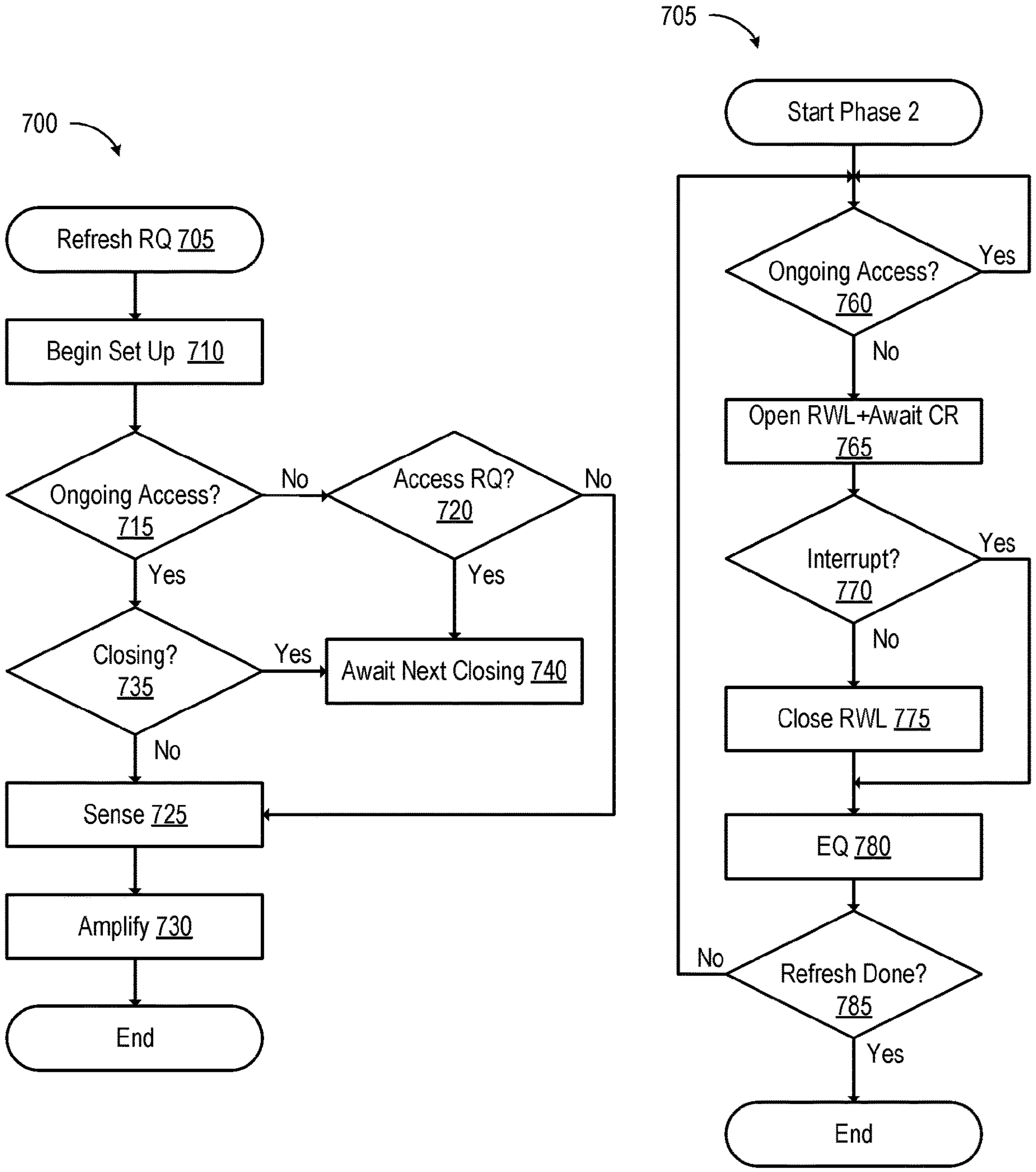
FIG. 7 depicts flowcharts 700 and 705 respectively illustrating refresh phases one and two.

FIG. 7 depicts flowcharts 700 and 705 respectively illustrating refresh phases one and two in accordance with another embodiment. The illustrated processes are directed by local control circuitry 125 acting upon refresh sense amplifier 135*r* and related circuitry illustrated in FIG. 3 in the manner detailed above. Refresh transactions can be scheduled using various strategies, a subset of which is detailed herein.

Beginning with refresh phase one, the process starts when local control circuitry 125 produces a refresh request (705) directed to a specific wordline, meaning that all the memory cells 120 connected to the specific wordline are to be read and their contents restored to the full voltage expressive of their stored values. The refresh request initiates a set-up period 710. Per decisions 715 and 720, if there is no ongoing read or write access, and an access request does not interrupt the set-up period, then phase one proceeds through the sense and amplify periods (725 and 730), bringing phase one to an end.

Returning to decision 715, if an access is ongoing when refresh set up begins, then local control circuitry 125 determines whether that access is closing (decision 735). If so, the set-up period does not have time to complete for the subsequent sense period 725 to be inserted into the access set-up period of a subsequent access transaction, a time during which sense period 725 will not interfere with an access transaction. Local control circuitry 125 thus awaits the next closing period (step 740) before transitioning to sense period 725. Per decision 720, local control circuitry 125 likewise awaits the next closing if an access request interrupts the refresh set-up period commenced in 710. Bitlines BL0*t* and BL0*c* are connected to interior nodes iBLt and iBLc of refresh sense amplifier 135*r* during sense period 725. Amplification period 730 does not require amplifier 135*r* be connected to bitlines BL0*t* and BL0*c* and can overlap the wordline closing and equalization periods of an access transaction.

Flowchart 705 illustrates a process implemented by local control circuitry 125 for refresh phase two, restoring a memory cell with the contents of refresh sense amplifier 135*r* acquired during refresh phase one. Local control circuitry 125 keeps track of unfinished refresh transactions and issues phase-two commands to complete them. Protocols for ensuring refresh commands are timely scheduled and completed to avoid loss of data are discussed below.

Per decision 760, if there is no ongoing read or write access then local control circuitry 125 opens the refresh wordline RWL, asserts signal ISOr, and awaits charge restoration CR (765). Local control circuitry 125 can interrupt refresh phase two to service an access request at any time before completion of charge restoration CR (decision 770) because refresh sense amplifier 135*r* retains the requisite bit and can be used for a subsequent attempt at phase two. The bitlines associated with the interrupted refresh transaction are equalized (780). In this case the wordline is closed concurrently with the equalize operation (not shown in the figure) as the data in the cell do not need to be preserved. Per decision 785, if the refresh was interrupted and thus not finished, the refresh phase two returns to start; otherwise, the refresh transaction is finished.

Refresh phase two can be interrupted repeatedly without loss of data because the data is retained in the refresh sense amplifier from refresh phase one. Refresh phase two must be accomplished at some point, however. Some embodiments implement a protocol in which the host controller allows each bank a periodic window free of access requests to allow the local control circuitry to complete phase two of any open refresh transactions.

Figure 8:
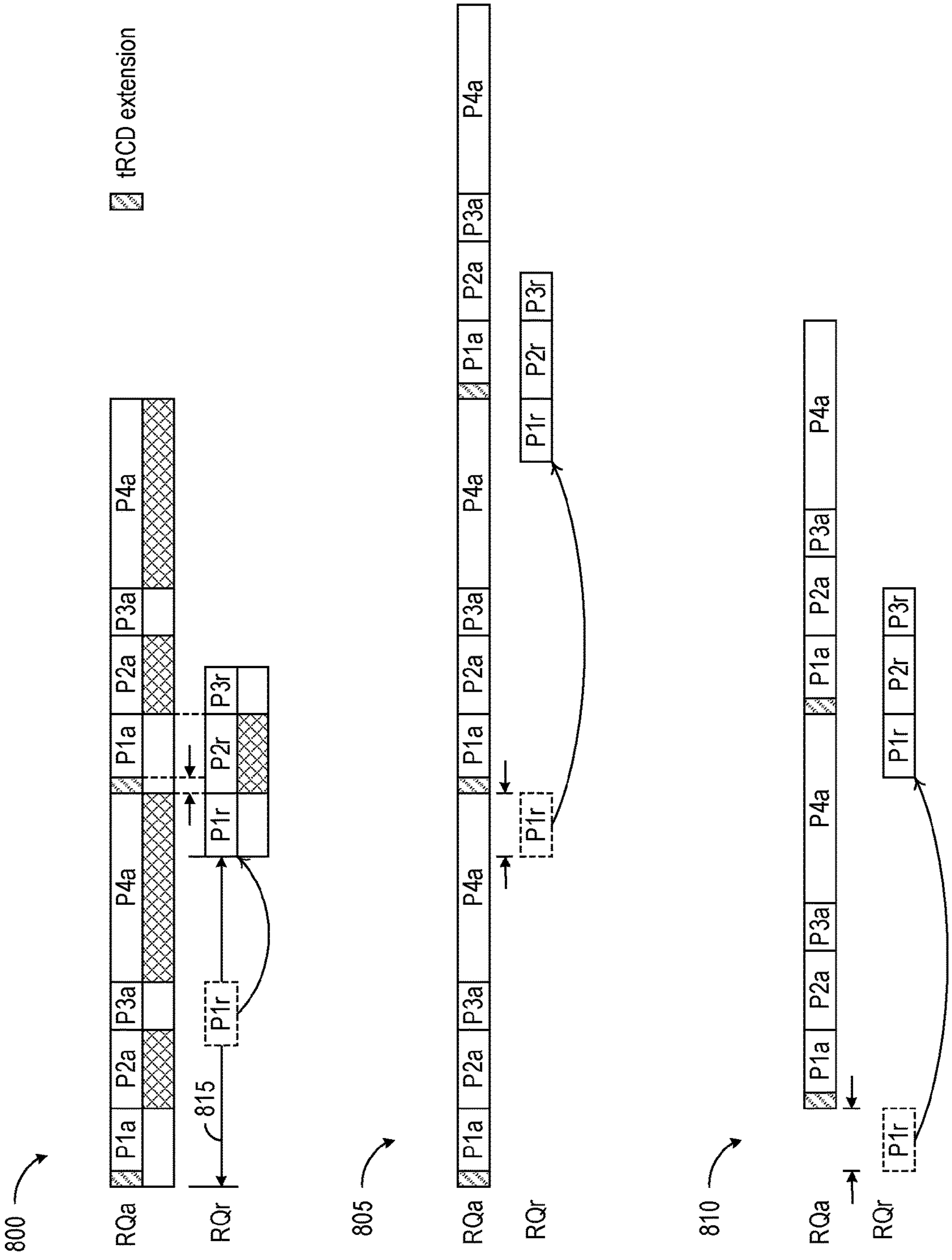
FIG. 8 depicts three timing diagrams 800, 805, and 810 illustrating how refresh phase one schedules bitline usage to periods in which they are not required for read and write transactions.

FIG. 8 depicts three timing diagrams 800, 805, and 810 illustrating how refresh phase one schedules bitline usage to periods in which they are not required for read and write transactions. This timing allows refresh transactions to be hidden from host controller 105. The protocol implemented by host controller 105 may require periodic bank-specific pauses to ensure all open refresh transactions have time to complete.

Access and refresh requests are designated RQa and RQr, respectively. An access request RQa is illustrated as occurring over four periods divided into those that require interaction with bitlines BL0*t* and BL0*c* that those that do not. A refresh request RQr, the first phase, is illustrated as occurring over three periods that are likewise divided. These periods are further detailed in connection with FIGS. 4 and 5. In this example, the first period of access request RQa, the set-up period P1*a* during which access commands are decoded, is not as long as sense period P2*r* of refresh request RQr. Set-up period P1*a* is extended by a small amount so local control circuitry 125 can time refresh sense period P2*r* to access bitlines BL0*t* and BL0*c* during set-up phase P1*a* of an access request, a period in which the access transaction is not employing the bitlines. The time extension is labeled a "tRCD extension," as the datasheet parameter affected by the time extension is the row column delay time which is a function of the time between the access request and the accessed data being available in the access sense amplifier.

Refresh phase 1 is completed after two consecutive regular accesses at the latest. The time required to equalize the bitlines before a regular access in phase 1 is short because it occurs directly after charge sharing, a time during which the bitline voltages are relatively close together. For access transactions, a fast decoding of the bank address and a fast generation of a bank-select signal, illustrated here as period P1*a* of access request RQa, enables rapid interruption of refresh transactions.

In diagram 800, any refresh request RQr initiated within interval 815—during an access request but before the access request is closing—is aligned with the access request RQa such that sense period P2*r* does not commence until the bitlines are available after the closing of the access request. Diagram 805 is similar to diagram 800 but the refresh transaction is further delayed because the refresh request arrived too late in the access transaction to complete set-up period P1*r* before the bitlines are relinquished by the access request. In diagram 810, refresh request RQr arrived before an access request RQa but not in time for refresh request RQr to fully overlap the first part of the subsequent but overlapping access request RQa. The sense period P2*r* is therefore time shifted so that part two P2*r* of the refresh request takes place after the access transaction is complete. Set-up period P1*r* is shown time shifted in diagrams 800, 805, and 810 but can be completed earlier.

Interleaving refresh and access transactions, adding the tRCD extension if needed, accommodates increased refresh rates with little or no impact on the host controller. This technique improves DRAM stability and can be used e.g. to counter row hammer, a security exploit in which certain patterns of access cause charge to leak between cells and possibly change the contents of memory rows that were not addressed in the original memory access.

Figure 9:
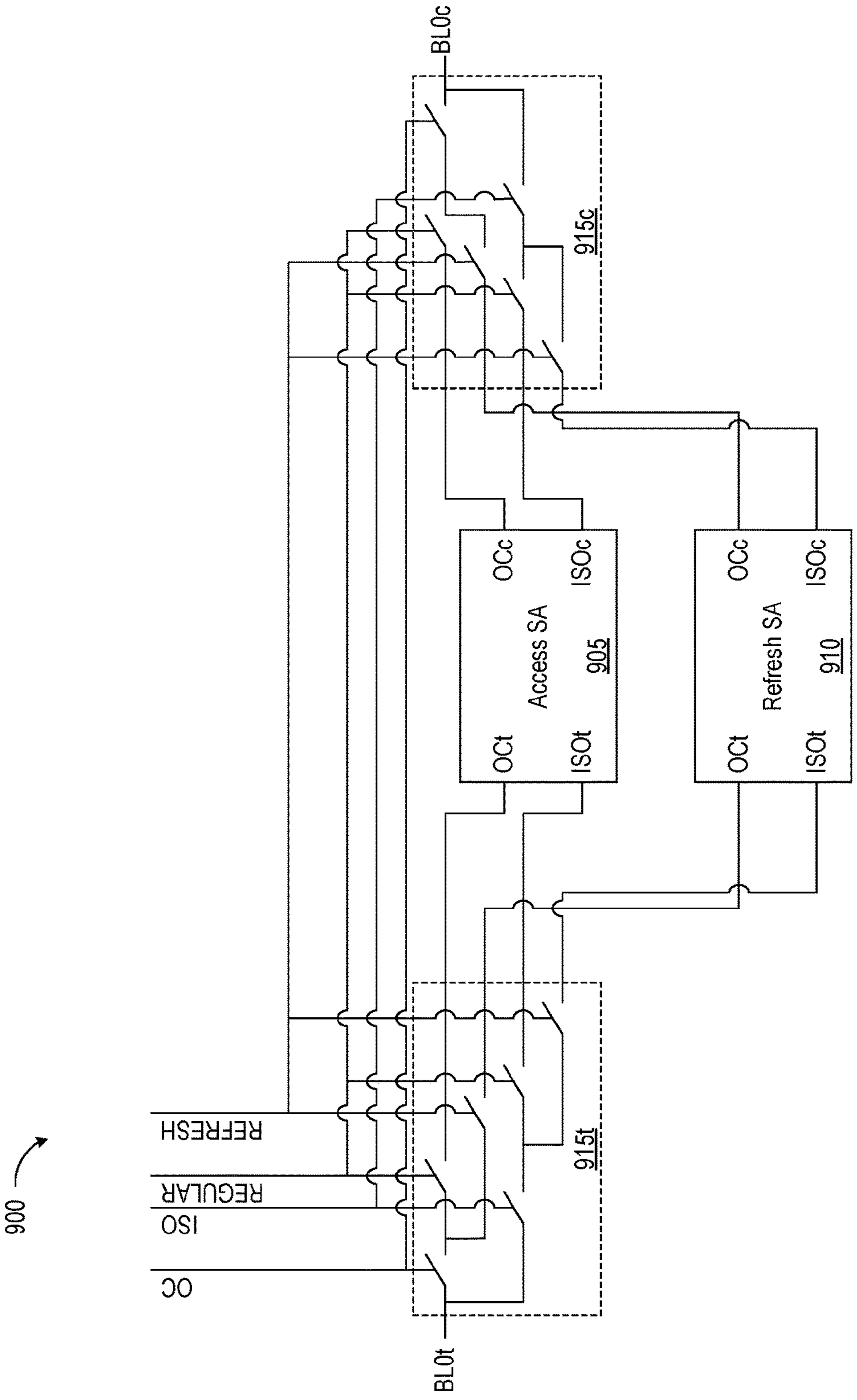
FIG. 9 depicts a sense-amplifier pair 900 in accordance with another embodiment.

FIG. 9 depicts a sense-amplifier pair 900 in accordance with another embodiment. Bitlines BL0*t* and BL0*c* are alternatively connected to an access sense amplifier 905 and a refresh sense amplifier 910 via switch networks 915*t* and 915*c*. Sense amplifiers 905 and 910 can be similar to sense amplifiers 135*a* and 135*r* of FIG. 3 but evaluate control block 315 is replaced with switch networks 915*t* and 915*c*. Signals OC and ISO control one or the other of sense amplifiers 905 and 910, as detailed previously, in dependence upon which of signals Regular (for regular access) and Refresh is asserted.

Returning to FIG. 1, memory system 100 can support a protocol in which host controller 105 issues refresh commands to memory 110 as needed to prevent data loss. While this technique is common, the time required for refresh transactions can be shortened because the time required for a refresh transaction is limited to what is needed for phase two only, a substantial time savings. An alternative refresh protocol requires each memory bank be allowed a window during which it will not be accessed (e.g., a refresh window of twenty-five nanoseconds every 1.9 microseconds). This protocol guarantees that there will be sufficient pauses in consecutive accesses to a bank so that memory 100 can complete open refresh transactions.

Another embodiment adds the worst-case time to complete a refresh transaction to the time required to precharge a row or memory cells, a time referred to as tRP in DRAM literature. This approach gives slightly worse memory-bus utilization for random closed page workloads compared to same-bank refresh, a protocol that allows refresh commands to be directed to one bank among a group of banks while the other banks remain open for normal operation. This approach is expected to improve, however, as DRAM evolves shorter retention times and larger capacities.

In some embodiments refresh commands from the host controller signal the DRAM that a bank or banks will not be the target of access requests for a specified window of time. Local control circuitry 125 maintains in refresh-open register 138 a list of open wordlines—wordlines for which refresh phase two has not been completed—and can use this window to complete open refresh transactions in those banks. Alternatively, the DRAM can attempt to complete open refreshes every time a wordline of a regular access closes. A pause prescribed in this protocol assures successful refresh completion within the refresh interval.

DRAM cell array architectures are expected to move from today's single layer of cells with an access transistor under the silicon surface to a 3D architecture with more than one layer of cells and access transistors in a metal stack. 3D DRAM architectures free up silicon area that can be used to instantiate refresh sense amplifiers and related structures.

Hidden refresh transaction can be performed by requesting refresh for one bank at a time, unlike all-bank refresh protocols by which all banks are refreshed simultaneously or same-bank refresh protocols in which banks are organized in groups and each refresh request is directed to one bank from each back group. Self-refresh as detailed herein supports a low-power mode in which DRAM 110 can power down all but what is required for self-refresh and to receive a wake-up signal from host controller 105. Host controller 105 can then ignore DRAM 110 until needed, at which time DRAM 110 can awaken quickly and without a requirement to synchronize refresh and access transactions.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is charged or discharged to a state other than the asserted state (including a high or low logic state, or the floating state that may occur when the signal driving circuit is transitioned to a high impedance condition, such as an open drain or open collector condition).

The output of the design process for an integrated circuit may include a computer-readable medium, such as, for example, a magnetic tape, encoded with data structures defining the circuitry can be physically instantiated as in integrated circuit. These data structures are commonly written in Caltech Intermediate Format (CIF) or GDSII, a proprietary binary format. Those of skill in the art of mask preparation can develop such data structures from schematic diagrams of the type detailed above.

While the invention has been described with reference to specific embodiments thereof, it will be evident that various modifications and changes may be made thereto without departing from the broader spirit and scope of the invention. Variations of these embodiments will be apparent to those of ordinary skill in the art upon reviewing this disclosure. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A method for accessing and refreshing memory cells in a dynamic, random-access memory (DRAM), the DRAM including a first memory cell selectively connected to a first bitline and a second memory cell selectively connected to the first bitline, the method comprising:

- receiving an access request for first data in the first memory cell;
- responsive to the access request:
  - sensing first charge from the first memory cell on the first bitline relative to a second bitline over a first sense period;
  - restoring the first charge to the first memory cell via the first bitline over a first charge-restoration period; and
  - setting the first bitline and the second bitline to a common voltage over a first equalization period;
- generating a refresh request for second data in the second memory cell during one of the first sense period and the first charge-restoration period; and
- responsive to the refresh request:
  - awaiting an end of the first equalization period; and
  - after the end, sensing second charge from the second memory cell on the first bitline relative to the second bitline over a second sense period.

2. The method of claim 1, wherein sensing the first charge from the first memory cell comprises connecting an access sense amplifier to the first bitline and the second bitline.

3. The method of claim 1, wherein sensing the second charge from the second memory cell comprises connecting a refresh sense amplifier to the first bitline and the second bitline.

4. The method of claim 3, further comprising receiving a second access request and decoding the second access request during the second sense period.

5. The method of claim 4, further comprising evaluating the refresh request during the charge-restoration period.

6. The method of claim 5, further comprising, responsive to the second access request:

- sensing third charge from a third memory cell on the first bitline relative to a second bitline over a third sense period; and
- restoring the third charge to the third memory cell via the first bitline over a third charge-restoration period.

7. The method of claim 6, further comprising starting restoration of the second charge to the second memory cell after the second sense period and interrupting the restoration of the second charge to the second memory cell before the second charge is restored responsive to the second access request.

8. The method of claim 7, further comprising restarting the restoration of the second charge to the second memory cell after restoring the third charge to the third memory cell.

9. A memory device comprising:

- an array of memory cells, the array of memory cells including columns of memory cells each selectively coupled to a bitline;
- an access sense amplifier coupled to the bitline;
- a refresh sense amplifier coupled to the bitline; and
- a control circuitry coupled to the access sense amplifier and the refresh sense amplifier, the control circuitry to:
  - control the refresh sense amplifier to connect to the bitline, sense a voltage on the bitline, amplify the sensed voltage into a bit voltage, store the bit voltage, and disconnect from the bitline;
  - control the refresh sense amplifier to reconnect to the bitline to charge the bitline toward a refresh voltage to refresh a memory cell; and
  - before the bitline charges to the refresh voltage;
  - disconnect the refresh sense amplifier from the bitline without having refreshed the memory cell; and
  - control the access sense amplifier to connect to the bitline.

10. The memory device of claim 9, the control circuitry to receive an access request and interrupt a refresh transaction responsive to the access request by the disconnect of the refresh sense amplifier before the refresh sense amplifier refreshes the memory cell.

11. The memory device of claim 9, the access sense amplifier connected to the bitline during an access transaction, the control circuitry further to await completion of the access transaction, control the refresh sense amplifier to reconnect to the bitline to charge the bitline toward the refresh voltage.

12. The memory device of claim 9, wherein the control circuitry is to generate refresh requests and receive access requests asynchronous with respect to the refresh requests.

13. The memory device of claim 12, wherein the control circuitry is to initiate the control of the refresh sense amplifier responsive to the refresh requests and disconnect the refresh sense amplifier from the bitline responsive to the access requests.

14. The memory device of claim 9, wherein the control circuitry is to generate a refresh request that initiates the control of the refresh sense amplifier to connect to the bitline.

15. The memory device of claim 14, wherein the control circuitry is to receive an access request after generating the refresh request, initiate an access transaction responsive to the access request, and delay connecting the refresh sense amplifier to the bitline until after the access transaction.

16. A method for accessing and refreshing memory cells in a dynamic, random-access memory (DRAM), the memory cells selectively connected to a bitline, the method comprising:

receiving successive first and second access requests directed to the bitline;

performing successive first and second access transactions responsive to the respective first and second access requests, each access transaction including an access set-up period and an access sense period;

generating a refresh request asynchronous with respect to the first and second access requests and directed to the bitline during the first access transaction and, responsive to the refresh request:

interpreting the refresh request over a refresh set-up period during the first access transaction; and sensing a voltage on the bitline over a refresh sense period during the set-up period of the second access transaction.

17. The method of claim 16, further comprising storing a voltage representative of a bit value responsive to the sensing of the bitline over the refresh period, awaiting an end of the second access transaction, and writing the voltage representative of the bit value to a memory cell selectively connected to the bitline.

18. The method of claim 16, further comprising sensing a closing of the first access transaction and timing the refresh sense period to the closing.

19. The method of claim 16, further comprising:

receiving successive third and fourth access requests directed to the bitline;

performing successive third and fourth access transactions responsive to the respective third and fourth access requests; and generating a second refresh request directed to the bitline during the third access transaction and, responsive to the second refresh request:

sensing a closing of the third access transaction; and timing a second refresh sense period after the fourth access transaction.

20. The method of claim 19, wherein sensing the closing comprises sensing a wordline signal.

21. The method of claim 16, further comprising amplifying the voltage on the bitline to a bit voltage representative of a bit, storing the voltage representative of the bit, receiving a read access request directed to the bitline, and reading the bit voltage representative of the bit responsive to the read access request.

* * * * *